United States Patent
Ueshima et al.

(10) Patent No.: US 8,315,510 B2
(45) Date of Patent: Nov. 20, 2012

(54) LIGHT EMITTING TYPE HEAT TREATMENT APPARATUS

(75) Inventors: Yukio Ueshima, Hyogo (JP); Shinji Suzuki, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 979 days.

(21) Appl. No.: 12/219,331

(22) Filed: Jul. 21, 2008

(65) Prior Publication Data

US 2009/0034948 A1 Feb. 5, 2009

(30) Foreign Application Priority Data

Jul. 20, 2007 (JP) ................................. 2007-189387

(51) Int. Cl.
A21B 2/00 (2006.01)

(52) U.S. Cl. ......... 392/416; 392/407; 219/483; 219/486

(58) Field of Classification Search .................. 392/407, 392/416; 219/483, 486
See application file for complete search history.

(56) References Cited

U.S. PATENT DOCUMENTS

| | | | | |
|---|---|---|---|---|
| 3,836,751 A * | 9/1974 | Anderson | ..................... | 219/411 |
| 4,680,451 A * | 7/1987 | Gat et al. | ..................... | 219/411 |
| 4,975,561 A * | 12/1990 | Robinson et al. | ............. | 219/390 |
| 5,781,693 A * | 7/1998 | Ballance et al. | .............. | 392/416 |
| 5,802,856 A * | 9/1998 | Schaper et al. | ................... | 62/3.7 |
| 6,090,210 A * | 7/2000 | Ballance et al. | .............. | 118/725 |
| 6,200,388 B1 | 3/2001 | Jennings | | |
| 6,207,936 B1 * | 3/2001 | de Waard et al. | ............. | 219/497 |
| 6,310,323 B1 * | 10/2001 | Mahawili et al. | ............. | 219/390 |
| 6,465,761 B2 * | 10/2002 | Stevens et al. | ................ | 219/411 |
| 6,727,474 B2 * | 4/2004 | Gat | ................ | 219/390 |
| 7,978,964 B2 * | 7/2011 | Ranish et al. | ................. | 392/416 |

FOREIGN PATENT DOCUMENTS

JP P2002-503884 A 2/2002

* cited by examiner

*Primary Examiner* — Thor Campbell

(57) ABSTRACT

A light emitting type heat treatment apparatus includes relatively low rated power density filament lamps and relatively high rated power density filament lamps, in which a heat treatment including a temperature raising heat process for raising a work piece quickly to a predetermined heat treatment temperature by light emitted from the filament lamps, and a constant temperature heating process succeeding the temperature raising heating process in which the work piece is heated while the predetermined heat treatment temperature is maintained, and a control unit which controls lighting state of the filament lamps so that while at least filament lamps with relatively high rated power density are lighted in the temperature raising heating process, in the constant temperature heating process, only filament lamps with relatively low rated power density are lighted.

20 Claims, 6 Drawing Sheets

LIGHT EMITTING TYPE HEAT TREATMENT APPARATUS

CROSS-REFERENCES TO RELATED APPLICATION

The disclosure of Japanese Patent Application No. 2007-189387, filed Jul. 20, 2007, including its specification, claims and drawings, is incorporated herein by reference in its entirety.

TECHNICAL FILED

The present invention relates to a light emitting type heat treatment apparatus which irradiates light to a work piece from, for example, a filament lamp, thereby performing a heat treatment, and specifically, relates to a light emitting type heat treatment apparatus for carrying out a rapid thermal processing of a semiconductor substrate at a comparatively low heat treatment temperature.

BACKGROUND

In recent years, for example, when performing various processes of, such as a silicon oxide-film formation (film forming) and impurity diffusion in a semiconductor manufacturing process, a work piece is heat-treated, for example, at a high temperature of 900-1200° C. (degrees Celsius) by light emitted from a light source. Especially, a rapid thermal processing (RPT) is used preferably. In the RPT, the temperature of the work piece, such as a semiconductor wafer is raised or lowered quickly, whereby the yield and the quality thereof can be improved. In a light emitting type heat treatment apparatus which performs such a RTP, for example, a filament lamp, in an arc tube of which a filament made of tungsten is arranged, is used as a heat source.

In recent years, for example, in order to reduce an operational voltage (threshold voltage) of a MOS transistor, in a process of formation of NiSi (nickel silicide) film or PdSi (palladium silicide) film, which is used for an electrode of a semiconductor element, it is necessary to heat-treat a semiconductor substrate which is a work piece, at a low temperature, for example, 100-500° C. (degrees Celsius) which is lower than that in the silicon dioxide film formation or impurity diffusion.

In prior art, as a method of forming a metallic silicide film, in general, for example, after forming a film of metal such as nickel (Ni) or palladium (Pd) on a surface of a silicon (Si) substrate by a sputtering method, the Si substrate is heat-treated using an electric furnace, whereby Si and metal are reacted with each other so that a metallic silicide compound is produced. However, when, in a formation of the metallic silicide film, a heat treatment is performed by using such an electric furnace, since the Si substrate is exposed to high temperatures over a long time within the electric furnace, a diffusion layer in a MOS channel deteriorates so that there is a possibility that a semiconductor device may be damaged.

As a means for avoiding damage of the semiconductor device by the above heat treatment, a rapid thermal processing (RTP) may be performed to the Si substrate by using a filament lamp as a heat source.

Moreover, for example, when the surface temperature of a work piece, such as a Si substrate, is uneven, a desired capability which is required for the semiconductor device may not be obtained. When performing the above processes, it is necessary to heat the Si substrate at a constant temperature distribution, without producing local variation in temperature.

However, when a light emitting type heat treatment apparatus in which a filament lamp is provided, is actually used and a heat treatment is performed under temperature conditions in which the surface temperature of the Si substrate becomes approximately 100-500° C. (degrees Celsius), variation in temperature is present in the Si substrate, that is, portions of high temperature and/or low temperature of the Si substrate are locally formed. Thus, there is a problem that it is not possible to heat the Si substrate so as to form a uniform temperature distribution.

This is because in such a rapid thermal processing using a filament lamp, usually, a temperature raising heat treatment for raising the surface temperature of a work piece to a desired heat treatment temperature for a short time of several seconds is performed. After that, a constant temperature heat treatment for heating the work piece for a predetermined time is performed in a state where the temperature of the work piece is maintained at the heat treatment temperature (refer to (a) of FIG. 3). In case where the work piece processed in such a rapid thermal processing is a Si substrate of $\phi$300 mm, in order to raise the surface temperature of the Si substrate quickly at a temperature raising speed of approximately 100 degrees Celsius/second (° C./sec) in the temperature raising heat treatment, a light emitting type heat treatment apparatus to which a large electric power of about 90 kW can be applied as rated power is required. When a constant temperature heat treatment is performed by a filament lamp provided in such a light emitting type heat treatment apparatus, in order to maintain the surface temperature of the Si substrate to a desired temperature, a filament lamp is driven in a state where electric energy supplied to the filament lamp is suppressed to approximately low electric power of 5 kW.

However, in the constant temperature heat treatment, when low electric power of approximately 5 kW is applied to light the filament lamp of the light emitting type heat treatment apparatus whose rated power is 90 kW, the light emission wavelength emitted from the filament lamp shifts to a long wavelength side as shown in FIG. 5, and the radiant intensity of the long wavelength side becomes large. That is, it has turned out that, as the electric power applied becomes low, there is a tendency that the light emission wavelength emitted from the filament lamp shifts to the long wavelength side. This is because, since in the filament lamp of the light emitting type heat treatment apparatus whose rated power is 90 kW, the mass and the surface area of the filament per unit length are designed to be so large that the filament may not be fused even if large electric power is applied, it is thought that when the electric power applied therein is small, the temperature of the filament more remarkably decreases lower than that at time of rated lighting.

On the other hand, it is known that a Si substrate has the light transmission characteristics as shown in (a) of FIG. 6, i.e., a tendency that, as a wavelength thereof is long, a transmittance thereof becomes high (the absorbance becomes low). Moreover, GaAs ((b) of FIG. 6), or Ge ((c) of FIG. 6) has a similar tendency to that of the Si. Therefore, when the lamp is driven by electric power which is sufficiently low, as compared with rated power, as the temperature of the filament decreases lower than that at the time of rated lighting, the light emission wavelength shifts to a long wavelength side, for example, the wavelength shifts to 1.1 micrometers (μm) or more, whereby the Si substrate transmits a great portion of light which is emitted from the filament lamp, without the light being absorbed by the Si substrate.

As mentioned above, in a rapid thermal processing of a Si substrate using a filament lamp, when a constant temperature heat treatment is performed by lighting the filament lamp by electric power sufficiently lower than rated power, the light emitted from the filament lamp is shifted to the long wavelength side which the Si substrate mainly transmits. As shown in FIG. 7, inside the light emitting type heat treatment apparatus in which the filament lamp 60 is accommodated, while the Si substrate which is a work piece W transmits light of the long wavelength side in a state where part of the light is absorbed therein, the light is repeatedly reflected between the reflector 61 located in the opposite side of the filament lamp 60 to the Si substrate, and inner faces of the chamber 65 in which the Si substrate is placed. Therefore, the temperature of the Si substrate is considered to become high or low locally, so that the temperature distribution of the Si substrate does not become uniform. In addition, a reference numeral 62 in FIG. 7 indicates a window member.

SUMMARY

From the above viewpoint, it is an object of the present invention to offer a light emitting type heat treatment apparatus capable of heat-treating a work piece so that the temperature distribution of the work piece may become uniform, in a rapid thermal processing in which a heat treatment temperature is set to a comparatively low temperature.

The present light emitting type heat treatment apparatus, comprises two types of filament lamps including two or more relatively low rated power density filament lamps and two or more relatively high rated power density filament lamps whose rated power density is higher than that of the two or more relatively low rated power density filament lamps, in which a heat treatment including a temperature raising heat process for raising a work piece quickly to a predetermined heat treatment temperature by light emitted from the filament lamps, and a constant temperature heating process succeeding the temperature raising heating process in which the work piece is heated while the predetermined heat treatment temperature is maintained; and a control unit which controls lighting state of the filament lamps so that while at least relatively high rated power density filament lamps are lighted in the temperature raising heating process, in the constant temperature heating process, only filament lamps with relatively low rated power density are lighted. The "rated power density" means a level of the rated power per unit length of a filament.

In the present light emitting type heat treatment apparatus, a color temperature of the filaments of the two types of filament lamps at time of rated lighting may be 2100 K (Kelvin) or more. Further, in the light emitting type heat treatment apparatus, the work piece may be a silicon wafer.

In the light emitting type heat treatment apparatus, two or more of the relatively low rated power density filament lamps are arranged so that central axes thereof extend in parallel to each other on a first central axis plane, and two or more of the relatively high rated power density filament lamps are arranged so that central axes thereof extend in parallel to each other on a second central axis plane and perpendicular to those of the two or more of the filament lamps, wherein the first central axis plane and the second central axis plane are parallel to each other, and wherein the first central axis plane is located in a side of the work piece.

The present light emitting type heat treatment apparatus has a control unit which controls the lighting state of filament lamps, so that while at least the relatively high rated power density filament lamps are lighted in a temperature raising heating process, only the relatively low rated power density filament lamps are lighted in a constant temperature heating process. Therefore, it is possible to apply sufficiently low electric power which is required for the constant temperature heat treatment. At the same time, since the color temperature of a filament can be changed into a high state, without causing the phenomenon in which light emission wavelength shifts to the long wavelength side with decrease in temperature of the filament, it is possible to obtain an optical output of wavelength light (which is absorbed by a work piece) which contributes to heating of the work piece, and which is necessary and sufficient but not excessive. Moreover, since an increase in the light of the long wavelength side which the work piece transmits can be suppressed, it is possible to certainly prevent variation in the temperature distribution of the work piece resulting from the light of the long wavelength from occurring. Therefore, the work piece can be heat-treated as desired in the state where the temperature distribution thereof becomes uniform.

BRIEF DESCRIPTION OF THE DRAWINGS

Other features and advantages of the present light emitting type heat treatment apparatus will be apparent from the ensuing description, taken in conjunction with the accompanying drawings, in which.

DESCRIPTION

The descriptions in the specification are provided for illustrative purposes only, and are not limiting thereto. An appreciation of various aspects of the present light emitting type heat treatment apparatus is best gained through a discussion of various examples thereof. The meaning of these terms will be apparent to persons skilled in the relevant arts based on the entirety of the teachings provided herein.

Figure 1:
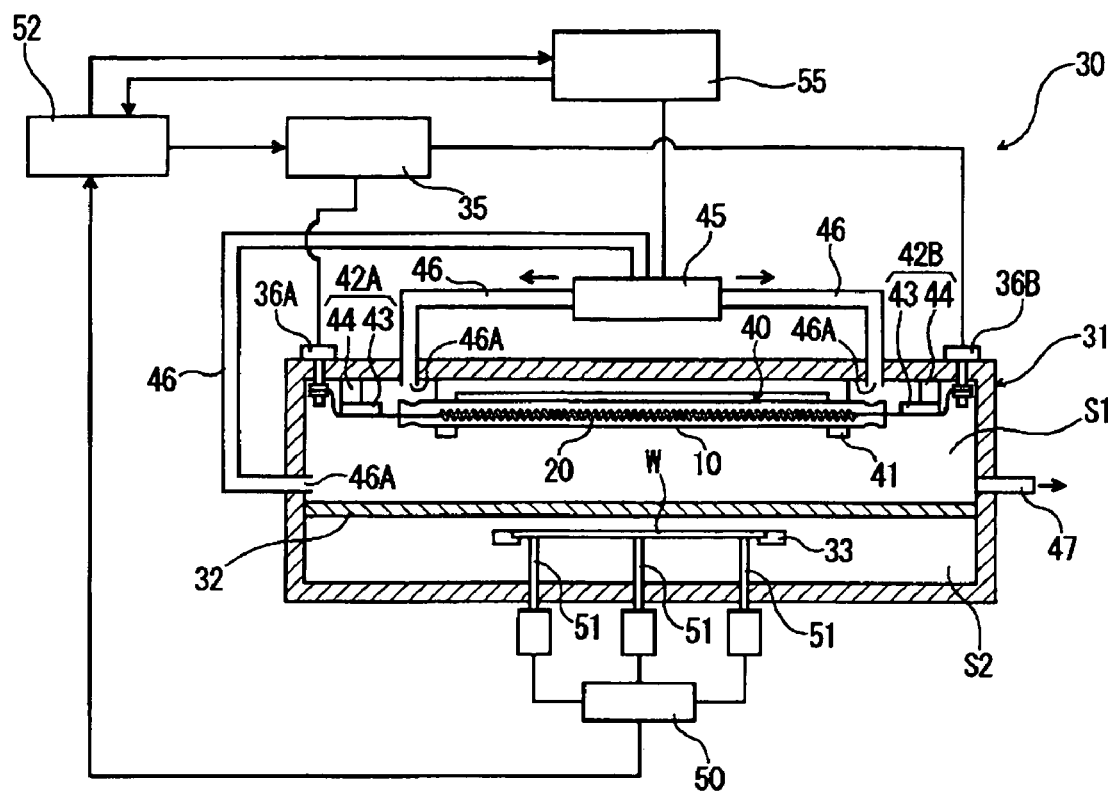
FIG. 1 is a schematic front cross sectional view of an example of the structure of a light emitting type heat treatment apparatus according to the present invention.

FIG. 1 is a schematic front cross sectional view of an example of the structure of a light emitting type heat treatment apparatus according to the embodiment. This light emitting type heat treatment apparatus 30 has a chamber 31 made of metal material, such as stainless steel. The interior space of the chamber 31 is divided, into up and down sides, that is, a lamp unit accommodation space S1 and a heat treatment space S2, by a plate like window member 32 made of, for example, quartz. While a lamp unit 40 made up of two or more filament lamps 10 is arranged in the lamp unit accommodation space S1, a reflection mirror 41 which reflects light emitted upward from the lamp unit 40 toward the work piece W is arranged above this lamp unit 40. Thereby, the light emitted from each filament lamp 10 of the lamp unit 40 is directly reflected by the reflection mirror 41, so as to irradiate the work piece W provided in the heat treatment space S2 through the window member 32.

As described below, the lamp unit 40 is made up of, for example, thirty one (31) filament lamps 10 in which the lamp central axes of the respective lamps are located in the same plane, and arranged in parallel so as to be apart from one another at predetermined intervals, so that a plane shape light source is formed. Sealing portions are formed in both ends of each filament lamp 10. Each filament lamp 10 has an arc tube made of, for example, glass material. While, for example, halogen gas is enclosed in an inner space of the arc tube, for example, a coil shape filament 20 which is made from a tungsten wire winded in the shape of a coil, is arranged so as to extend along with the tube axis of the arc tube.

The reflection mirror 41 is made from base material such as oxygen free high conductivity copper, on which gold is coated. A cross sectional view of a reflective section has the shape chosen from part of circle, part of ellipse, part of parabola, a plate, and the like.

Each filament lamp 10 of the lamp unit 40 is supported by a pair of fixed bases 42A and 42B. The fixed bases 42A and 42B are made up of an electric conduction stand 43 made of a conductive material, and a holding stand 44 made of insulating material, such as ceramics. The holding stand 44 is provided on an inner wall of the chamber 31, and holds the electric conduction stand 43.

A pair of power supply ports 36A and 36B to which electric supply lines from a power supply apparatus of a power supply section 35 are connected, is provided in the chamber 31. The number of pairs of power supply ports 36A and 36B is set up according to the number of the filament lamps 10 etc. The power supply port 36A is electrically connected with the electric conduction stand 43 of one (42A) of the fixed bases 42A and 42B. The electric conduction stand 43 of the fixed base 42A is electrically connected with an external lead of one end side of the filament 20 in a filament lamp 10. Moreover, the power supply port 36B is electrically connected with the electric conduction stand 43 of the fixed base 42B in another side, and the electric conduction stand 43 of this fixed base 42B is electrically connected with an external lead of another end of the filament. In addition, an electric connection state between the filament lamp 10 which forms the lamp unit 40, and the power supply apparatus which forms the power supply section 35, will be described below in detail. By such a structure, it becomes possible to supply electric power to each filament lamp 10 in the lamp unit 40 by each power supply apparatus in the power supply section 35, and the irradiance distribution on a work piece W can be set up arbitrarily and with high precision.

In the light emitting type heat treatment apparatus 30, a cooling mechanism for cooling each filament lamp 10 when the work piece W is heat-treated, is provided. Specifically, cooling air from a cooling air unit 45 provided outside the chamber 31 is introduced into the lamp unit accommodation space S1 through blow-off mouths 46A of each cooling air supply nozzle 46 provided in the chamber 31. By blowing the cooling air over each filament lamp 10 in the lamp unit 40, the arc tube in each filament lamp 10 is cooled down, and then the cooling air which becomes high temperature by heat exchange is discharged to the outside from a cooling air discharge port 47 formed in the chamber 31. Since in such a cooling mechanism, the sealing portions of each filament lamp 10 have a low thermal resistance as compared with the other parts, it is desirable that the blow-off mouths 46A of the respective cooling air supply nozzles 46 be formed so as to face the sealing portions of each filament lamp 10, thereby preferentially cooling down the sealing portions f each filament lamp 10.

In addition, a flow of the cooling air introduced into the lamp unit accommodation space S1, is designed to not to conversely heat each filament lamp 10 by the cooling air which becomes high temperature by heat exchange, but to cool down the reflection mirror 41 simultaneously. Moreover, when the reflection mirror 41 has the structure in which water cooling is carried out by a water-cooled mechanism (not shown in the figures), the flow of a cooling air does not necessarily need to be set up so that the reflection mirror 41 may also be cooled simultaneously.

Moreover, in this light emitting type heating apparatus 30, the blow-off mouths 46A of the cooling air supply nozzles 46 are formed in a position near the window member 32, so that the window member 32 is cooled by the cooling air from the cooling air unit 45. Thereby, it is possible to certainly prevent problems, such as a redundancy of the temperature controllability of the work piece W resulting from undesirable heating action received by the work piece W (for example, overshoot, that is, the temperature of the work piece becomes high temperature from a set temperature), a deterioration of temperature uniformity in the work piece W resulting from the temperature variation of the window member 32 itself in which heat is accumulated, or a deterioration of a temperature falling speed of the work piece W, due to heat rays secondarily emitted from the window member 32 in which heat is accumulated by radiant heat from the heated work piece W.

On the other hand, the processing stand 33 to which the work piece W is fixed is provided in the heat treatment space S2 of the chamber 31. When, for example, the work piece W is a semiconductor wafer, it is desirable that the processing stand 33 be a thin plate annular member made of molybdenum, tungsten, high melting point metal material such as tantalum, ceramic material such as silicon carbide (SiC), quartz, or silicon (Si), and is in form of a guard ring structure, in which a step portion is formed in an inner peripheral portion of the circular opening, which supports the semiconductor wafer. In the processing stand 33 having such a structure, the work piece W is inserted in the circular opening, and is supported by the step portion from the lower surface. Since the processing stand 33 itself is raised to a high temperature by the light emitting, the outer circumference edge of the semiconductor wafer which the processing stand faces, is auxiliarily heated by radiant, so that the temperature fall of the circumferential edge of the semiconductor wafer which attributes to the thermal radiation etc. from the outer circumference edge of the semiconductor wafer is compensated.

In the back side of the work piece W placed in the processing stand 33, a plurality of thermometry sections 51 for monitoring the temperature distribution of the work piece W, each of which is made up of, for example, a thermocouple or a radiation thermometer, is provided so as to be brought into contact with or adjacent to the work piece W. Especially the number and the arrangement position of the thermometry sections 51 is not limited thereto, and can be set according to the size of the work piece W. Each thermometry section 51 is connected to the thermometer 50. The temperature information which is monitored at predetermined timing (for example, 50 times per second) is transmitted to the thermometer 50.

The thermometer 50 has functions of computing the temperature in the measurement point of each thermometry section 51 based on the temperature information which is monitored by each thermometry section 51, and of sending out the computed temperature information to a main control unit 55 through a temperature control unit 52.

The main control unit 55 has a function of sending out instructions to the temperature control unit 52 based on the temperature information in each measurement point on the work piece W acquired by the thermometers, so that the temperature on the work piece W may be in a uniform distribution state at a predetermined temperature. Moreover, at time of lighting of the filament lamps 10 in the lamp unit 40, the main control unit 55 sends out instructions to the cooling air unit 45, and the cooling air unit 45 supplies cooling air based on these instructions, so that the arc tube, the reflection mirror 41, and the window member 32 may not be in a high temperature state.

The temperature control unit 52 has a function of controlling the amount of electric power supplied to the filament 20 of each filament lamp 10 from the power supply section 35, based on instructions from the main control unit 55. Moreover, the temperature information used as an attainment target according to, for example, a kind of work piece W and processing to be performed etc., can be set to the temperature control unit 52 in advance.

Figure 2:
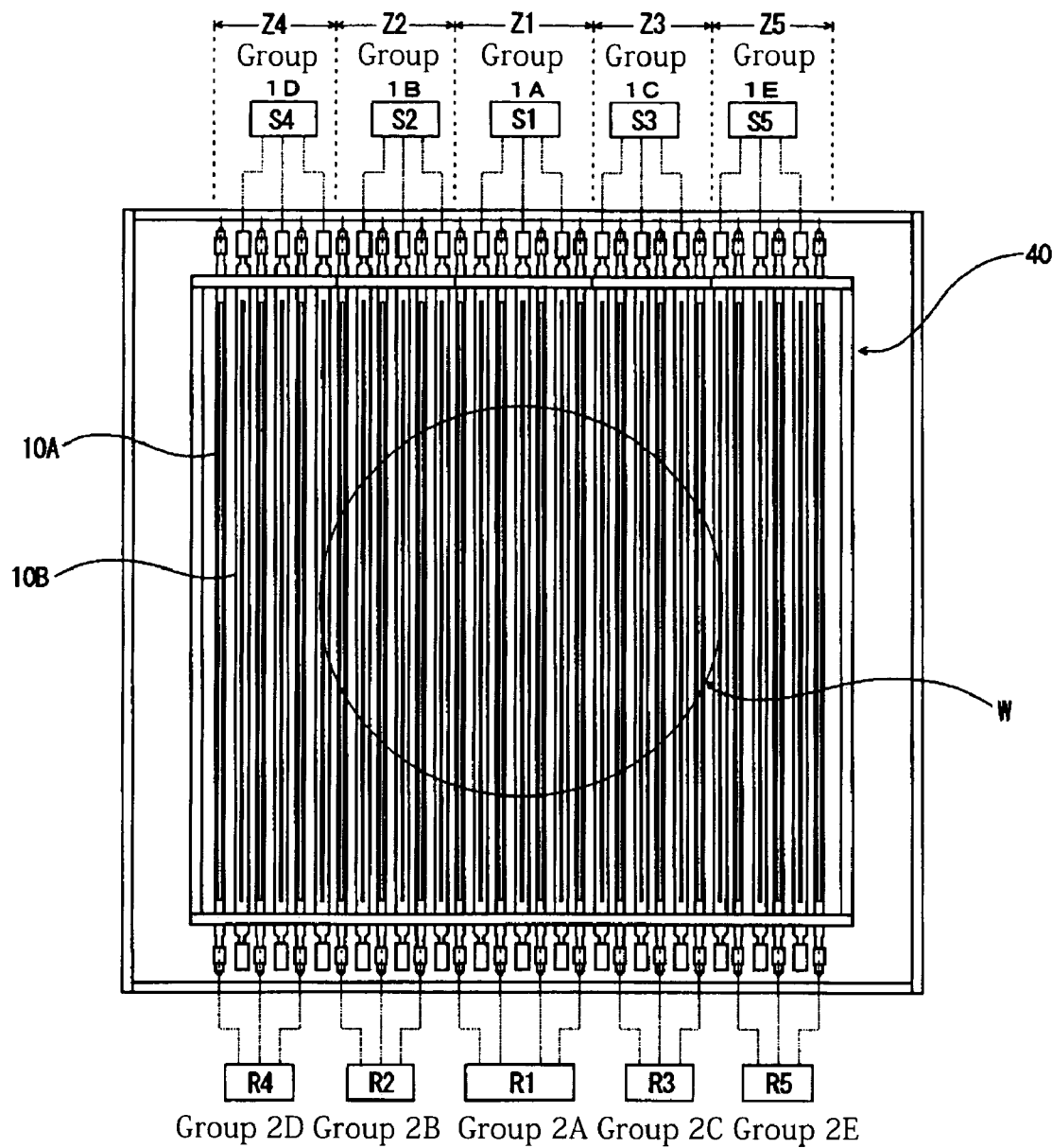
FIG. 2 is a plan view of a work piece and filament lamps which form a lamp unit in a light emitting type heat treatment apparatus shown in FIG. 1.

In the above-mentioned light emitting type heat treatment apparatus 30, a rapid thermal processing comprises a temperature raising heating process in which a temperature of the work piece W is quickly raised to a target heat treatment temperature, and a constant temperature heating process performed successively after the temperature raising heating process, in which the work piece W is heated while the target heat treatment temperature is maintained. The rapid thermal processing is performed at a state where the target heat treatment temperature is set to a comparatively low temperature, for example, in a range of 100-500 degrees Celsius (° C.). The lamp unit 40 comprises two kinds of filament lamps, that is, filament lamps with relatively high rated power density, which are used in the temperature raising heating process (hereinafter referred to as "temperature raising heating lamps"), and filament lamps with relatively low rated power density (hereinafter referred to as "constant temperature heating lamps") which are mainly used in the constant temperature heat treatment process. As shown in FIG. 2, in the lamp unit 40 according to the embodiment, fifteen (15) temperature raising heating lamps 10B and sixteen (16) constant temperature heating lamp 10A are alternatively arranged on the same plane. The distance between a temperature raising heating lamp 10B and a constant temperature heating lamp 10A which is next to each other is 15 mm.

It is desirable that the color temperature of the filaments of the temperature raising heating lamps 10B and the constant temperature heating lamps 10A, be 2100 K (Kelvin) or more at time of rated lighting (when rated power is applied so as to light them), and preferably 2100-3200 K or more. When the controllability at time of temperature adjustment and lamp life span are taken into consideration, it is especially desirable that the color temperatures of the filament be 2300-3000 K. Since the temperature of the filament becomes too low when the color temperature of the filament is less than 2100 K, in the light emitted from the filament lamp, an optical output in a long wavelength range of 1.1 micrometers (μm) or more which a silicon wafer transmits, becomes large, whereby there is a problem that the temperature distribution on a silicon wafer becomes uneven.

It is desirable that the output ratio relation of the constant temperature heating lamps 10A, and the temperature raising heating lamps 10B be (the constant temperature heating lamp 10A)/(the temperature raising heating lamp 10B)≦¼. This is because the acceptable range of the electric power adjustment (limiting) capable of being fit in a range of a desirable color temperature is 1/1-¼, so that unless it is set to a ratio smaller than that, the advantage (merit) of preparing two kinds of filament lamps cannot be not acquired. It is desirable that the temperature raising heating lamps 10B have the rated power density capable of applying large electric power to the filament, so that the temperature of the work piece W can be raised at a temperature raising speed of, for example, 10 degrees Celsius per second (° C./sec).

In the above-mentioned light emitting type heat treatment apparatus 30, when heat-treating the work piece W, the work piece W is divided into three zones Z1-Z3, and lighting of each filament lamp is controlled so that the temperature distribution of each of the zones Z1-Z3 may be acquired according to the physical property etc. of the work piece W. In order to perform such temperature distribution control on such a work piece W, the temperature raising heating lamps 10B and the constant temperature heating lamps 10A which form the lamp unit 40, are grouped into sets of two or more lamps, according to the respective zones Z1-Z3 of the work piece W, and these groups of lamps are connected with respective separate power supply apparatuses.

Specifically, three temperature raising heating lamps 10B which form the lamp unit 40 are grouped as one unit, and a total of five (5) groups (1A-1E) are formed. Each lamp group (1A-1E) is electrically connected to a separate power supply apparatus (S1-S5). Moreover, as to the constant temperature heating lamps 10A which form the lamp unit 40, four constant temperature heating lamps 10A located at the center thereof are grouped, so as to form a lamp group 2A. Lamp groups 2B-2E, each of which is made up of three constant temperature heating lamps (as one unit), are arranged in both sides of the lamp group 2A. Each lamp group (2A-2E) is electrically connected to the respective separate power supply apparatuses R1-R5. In the lamp unit 40, the lamp groups (1A-1C, and 2A-2C) located in the center thereof correspond to the respective zones Z1-Z3 of the work piece W, and the lamp groups (1D, 1E and 2D, 2E) located in the both sides of the lamp unit 40 serve so as to compensate the temperature fall of the circumferential edge area (Z4, Z5) of the work piece W.

The specification of an example of the constant temperature heating lamps 10A and the temperature raising heating lamps 10B which form the above-mentioned lamp unit 40 will be described below. For example, the work piece W is a silicon wafer having the diameter of ϕ300 mm. The temperature raising heat treatment is performed by only the temperature raising heating lamps 10B. When a heat-treatment is performed in which the temperature raising speed of the silicon wafer is set to 100 degrees Celsius per second (° C./sec), and the heat treatment temperature is set to 400 degrees Celsius (° C./sec), while electric power of approximately 90 kW (the total electric power) is needed for the lamp unit 40 as a whole in temperature raising heat treatment, the electric power needed in the constant temperature heat treatment is low electric power of approximately 5 kW. Therefore, in each of the temperature raising heating lamps 10B, for example, the length of a filament is 40 cm, rated power density is 150 W/cm, rated power is 6 kW, rated voltage is 200 V and the color temperature of the filament at time of rated lighting is 3000 K. In each of the constant temperature heating lamps 10A, for example, the length of a filament is 40 cm, rated power density is 8 W/cm, rated power is 320 W, rated voltage is 200 V and the color temperature of the filament at time of rated lighting is 3000 K. In addition, rated power density is usually determined by taking into consideration basic electric power and a control margin thereof.

Figure 3:
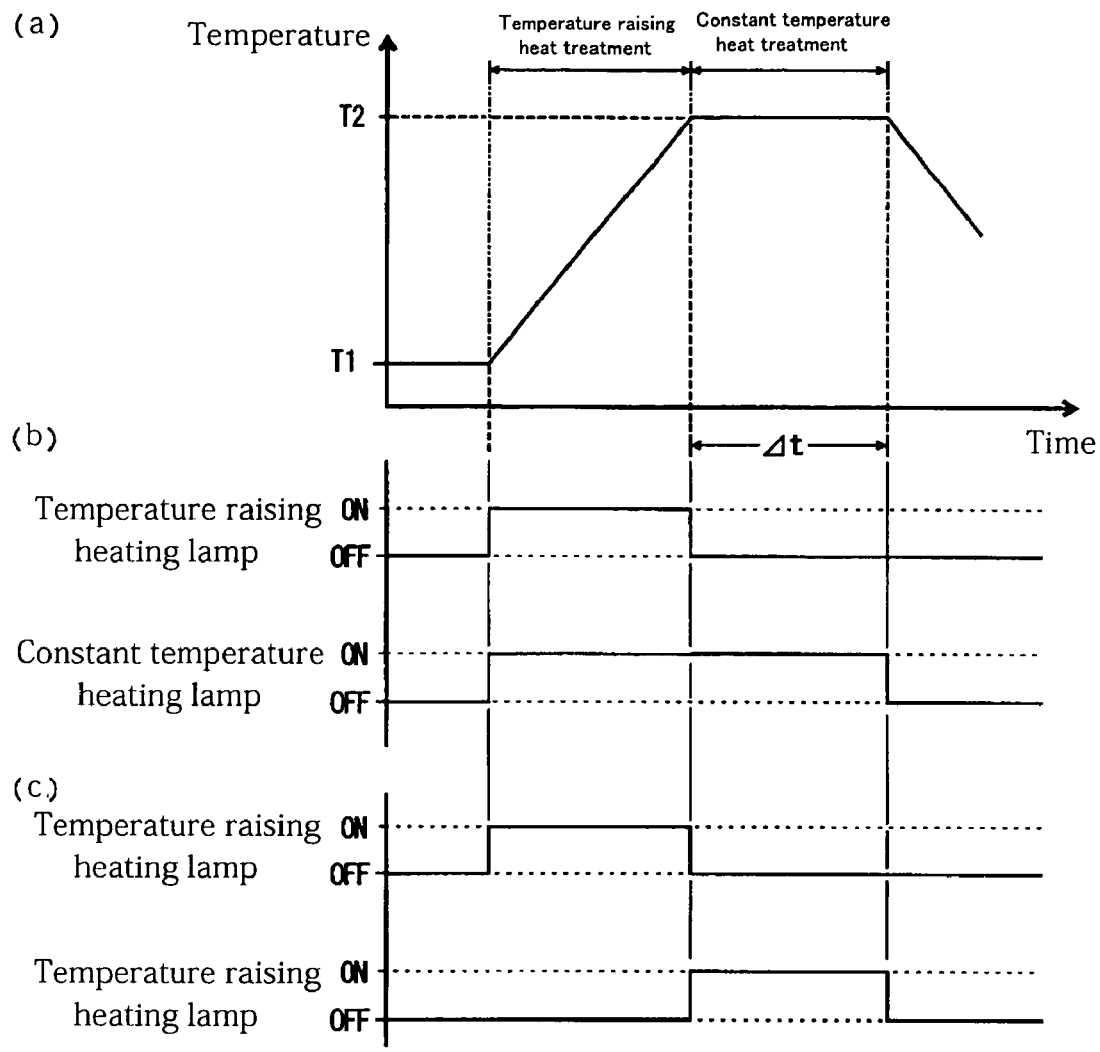
FIG. 3 is a timing chart for explaining a rapid thermal processing method performed in a light emitting type heat treatment apparatus, wherein (a) is a temperature profile, (b) is a timing chart showing an example of a control method of a lighting state of a filament lamp, and (c) is a timing chart of another example of a control method of a lighting state of a filament lamp.

As mentioned above, as shown in (a) of FIG. 3, for example, in the light emitting type heat treatment apparatus, after the temperature raising heat treatment is performed for a short time of approximately several seconds, so as to quickly raise the temperature T1 of the work piece W to the target heat treatment temperature T2, the constant temperature heat treatment for heating the work piece W is performed by maintaining the temperature of the work piece W at the heat treatment temperature T2 for a predetermined time ($\Delta t$).

When a heat treatment of the work piece W is carried out, while, first, in the temperature control unit 52, the heat treatment temperature T2, i.e., the temperature at time of constant temperature heat treatment, (attainment temperature) is set up according to the processing to be performed to the work piece W, the predetermined number of counts counted by a counter built in the temperature control unit 52, i.e., time $\Delta t$ during which the constant temperature heat treatment is carried out, is set up. And when an electric supply start signal is transmitted to the main control unit 55 from the temperature control unit 52, the main control unit 55 transmits an electric supply start signal to each power supply apparatus (S1-S5, and R1-R5) through the temperature control unit 52. For example, as shown in (b) of FIG. 3, the electric power (rated power) which is controlled to an appropriate level is applied to each temperature raising heating lamp 10B and each constant temperature heating lamp 10A, so that each temperature raising heating lamp 10B and each constant temperature heating lamp 10A are lighted. When a temperature raising heat treatment is started by light emitted from each of the temperature raising heating lamps 10B and each of the constant temperature heating lamps 10A, the heat treatment temperature T2 set up in advance and information about the actual surface temperature of the work piece W acquired by the thermometer 50 are compared with each other and judged by the temperature control unit 52. When it is confirmed that the actually measured temperature of the work piece W is lower than the heat treatment temperature T2, the electric supply to the temperature raising heating lamps 10B and the constant temperature heating lamps 10A is continued. Moreover, in the process in which the temperature of the work piece W is raised to the heat treatment temperature T2, the temperature distribution state of the work piece W is monitored by the temperature control unit 52. Namely, in order that the temperature of each of the zones Z1-Z3 of work pieces W divided into three becomes uniform, the electric energy supplied to every lamp group (1A-1E, 2A-2E) is adjusted, based on the temperature information on each zone (Z1-Z3) of the work piece W detected by each thermometer 50.

Subsequently, the temperature control unit 52 compares the heat treatment temperature T2 set up in advance with the temperature information of the actual surface temperature (actual measurement) of the work piece W detected by each thermometer 50. When it is confirmed that the temperature of the work piece W has reached the heat treatment temperature T2, an electric supply stop signal is transmitted to the main control unit 55 so that the temperature control unit 52 stops only the electric supply to each of the temperature raising heating lamps 10B, and the main control unit 55 transmits the electric supply stop signal to the power supply apparatus (S1-S5) of each of the lamp groups 1A-1E for the respective temperature raising heating lamps 10B through the temperature control unit 52, so that while the temperature raising heating lamp 10B is turned off, a count start signal is transmitted to the counter, synchronizing with the electric supply stop signal, and thereby, the constant temperature heat treatment is performed to the work piece W, following the temperature raising heat treatment.

In a state where it is maintained at the constant heat treatment temperature T2 in the constant temperature heat treatment, the temperature of each zone (Z1-Z3) of the work piece W divided into three is monitored so that the temperature distribution of the work piece W may become uniform. Namely, the temperature control unit 52 compares the heat treatment temperature T2 set up in advance with the temperature information about the actual surface temperature of the work piece W transmitted from the thermometer 50, and judgment is performed. When it is confirmed that the actually measured temperature of the work piece W is higher than the heat treatment temperature T2, an electric supply reduction signal is transmitted to the main control unit 55 so that the amount of electric supply to each constant temperature heating lamp 10A may be reduced, and the electric supply reduction signal is transmitted to the power supply apparatuses R1-R5 by the main control unit 55 through the temperature control unit 52, whereby the amount of electric supply to each constant temperature heating lamp 10A is reduced. On the other hand, when it is confirmed that the actually measured temperature of the work piece W is lower than the heat treatment temperature T2, an electric supply increase signal is transmitted to the main control unit 55 so that the amount of electric supply to each constant temperature heating lamp 10A may be increased, and the electric supply increase signal is transmitted to the power supply apparatuses R1-R5 by the main control unit 55 through the temperature control unit 52, whereby the amount of electric supply to each constant temperature heating lamp 10A is increased. By adjusting the amount of electric supply to such a constant temperature heating lamp 10A, the temperature of the work piece W is maintained at a constant heat treatment temperature T2. In the process in which the temperature of the work piece W is maintained at the constant temperature heat treatment T2, in order that the temperature of each of zones (Z1-Z3) of the work piece which are divided into three becomes uniform, the electric energy supplied to each of the lamp group 2A-2E is adjusted based on the temperature information on each zone (Z1-Z3) of the work piece W detected by each thermometer 50.

When it is confirmed that the number of counts counted by the counter is matched with the number of counts set in advance, that is, when the temperature control unit 52 confirms that the predetermined constant temperature heat treatment time $\Delta t$ elapses, an electric supply stop signal is transmitted to the main control unit 55 so that the electric supply to each constant temperature heating lamp 10A may be stopped, and an electric supply stop signal is transmitted to the power supply apparatus R1-R5 by the main control unit 55 through the temperature control unit 52, whereby the electric supply to each constant temperature heating lamp 10A is stopped, so that each constant temperature heating lamp 10A is turned off.

The heat treatment conditions of the above rapid thermal processing are shown below. For example, the heat treatment temperature (attainment temperature) T2 is 100-500 degrees Celsius (° C.). The temperature raising speed of the work piece W in the temperature raising heat treatment is 10-150 degrees Celsius/second (° C./sec), and the constant temperature heat treatment time $\Delta t$ is 1-600 seconds. Moreover, as shown in (c) of FIG. 3, by turning on only the temperature raising heating lamps 10B, the temperature raising heat treatment may be performed, and thus it can set up suitably according to the purposes of a process and/or a heat treatment temperature etc. to be performed to the work piece W.

As mentioned above, according to the light emitting type heat treatment apparatus 30 having the above-mentioned structure, the lighting state of the temperature raising heating lamps 10B and the constant temperature heating lamps 10A is controlled, so that while at least the temperature raising heating lamps 10B with relatively high rated power density are turned on in the temperature raising heating process, only the constant temperature heating lamps 10A with relatively low rated power density are turned on in the constant temperature heating process. While when performing the constant temperature heat treatment, since it is possible to apply sufficiently low electric power required for the constant temperature heat treatment and at the same time the color temperature of the filament can be made high, the light emission wavelength does not shift to a long wavelength side, with the temperature fall of the filament. It is possible to acquire an optical output which is necessary and sufficient but not excessive, for the light wavelength (absorbed by the work piece) which contributes to heating of the work piece W. Since an increase of light of the long wavelength side which the work piece W transmits can be suppressed, it is possible to certainly prevent variation in the temperature distribution of the work piece W, resulting from the light of the long wavelength side. Therefore, it is possible to perform a desirable heat-treatment in a state where the temperature distribution of the work piece W becomes uniform.

Moreover, since in the constant temperature heating lamps 10A and the temperature raising heating lamps 10B, the color temperature of the filaments at time of rated lighting is 2100 K (Kelvin) or more, a sufficiently high optical output with light of the wavelength which contributes to heating of the work piece W, for example, a wavelength of 1.1 micrometers (μm) or less in case where the work piece W is a silicon wafer, can be certainly obtained so that desired heat treatment can be ensured.

The present light emitting type heat treatment apparatus is very useful when performing a process which is required to perform a rapid thermal processing in which a heat treatment temperature thereof is set to a comparatively low temperature.

Figure 4A:
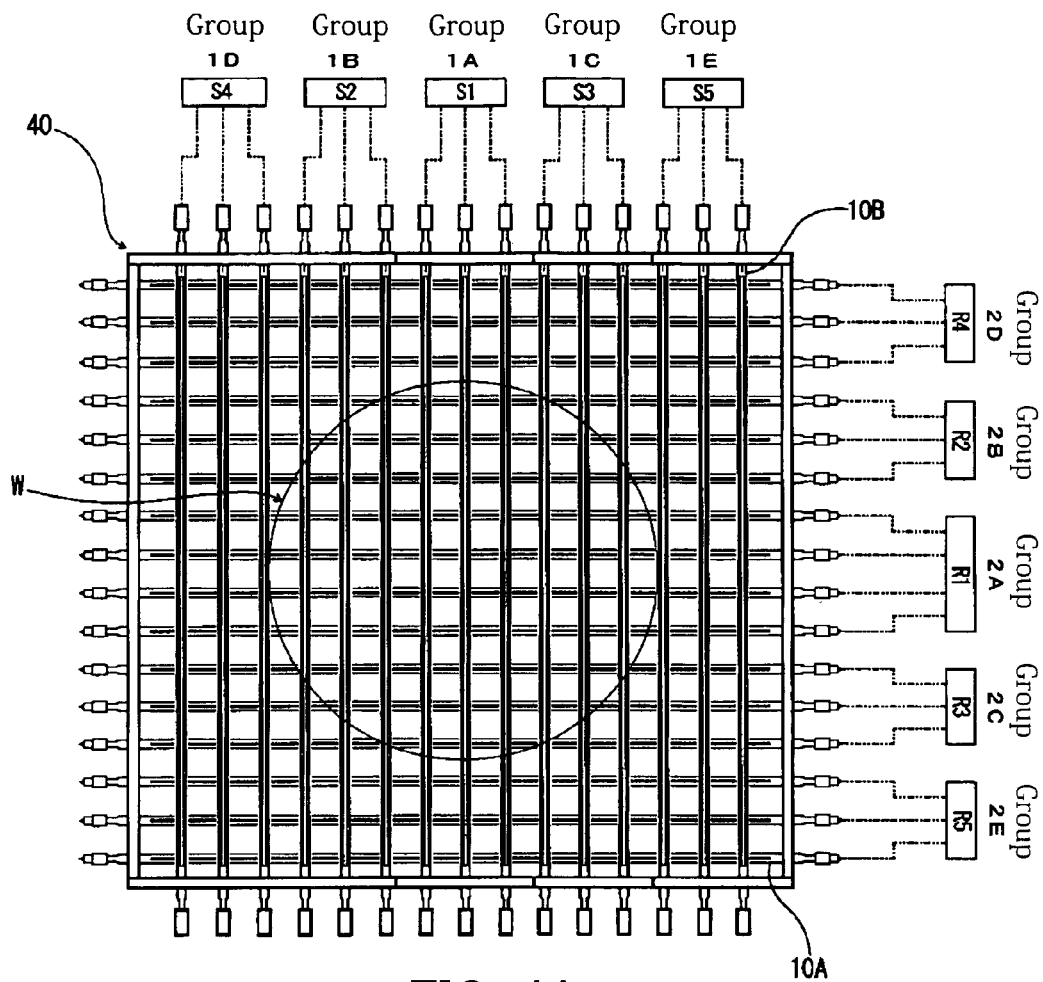
FIG. 4A is a plan view of an arrangement example of a filament lamp and a work piece in a lamp unit of a light emitting type heat treatment apparatus.
Figure 4B:
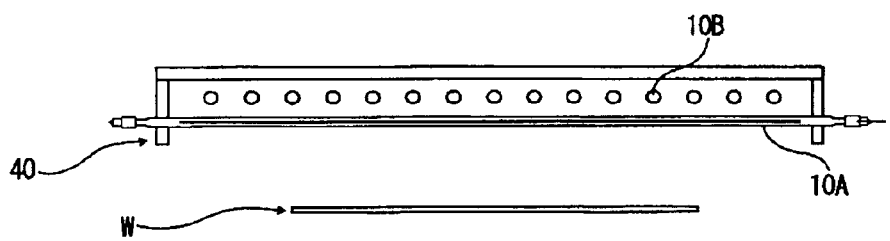
FIG. 4B is a front cross sectional view thereof, taken along a line perpendicular to a tube axis of a filament lamp for a temperature raising heat treatment.
Figure 5:
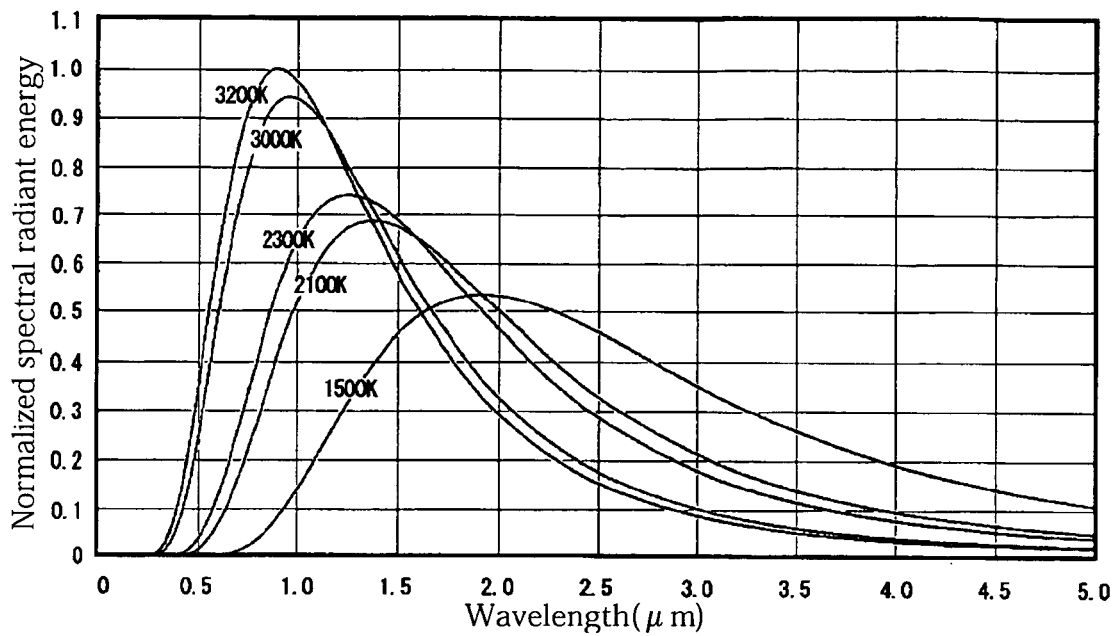
FIG. 5 is a graph of spectral radiant in case where the total radiant energy (lamp electric power density) is the same.
Figure 6:
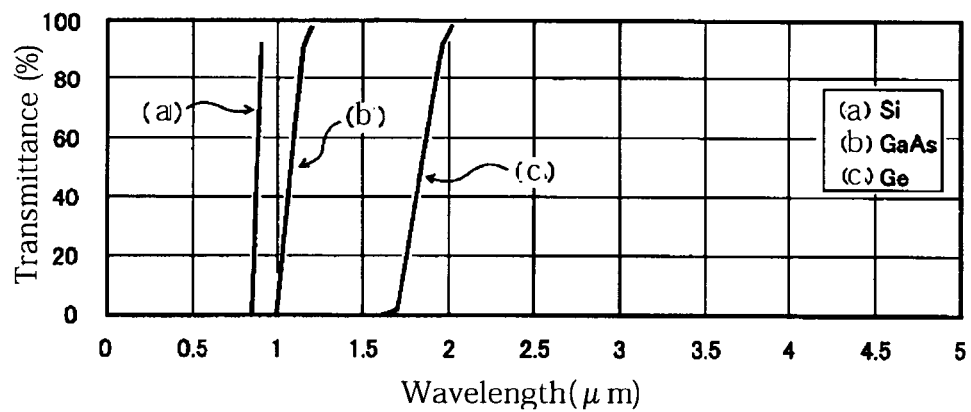
FIG. 6 is a graph showing light transmission characteristics of (a) Si, (b) GaAs, and (c) Ge.
Figure 7:
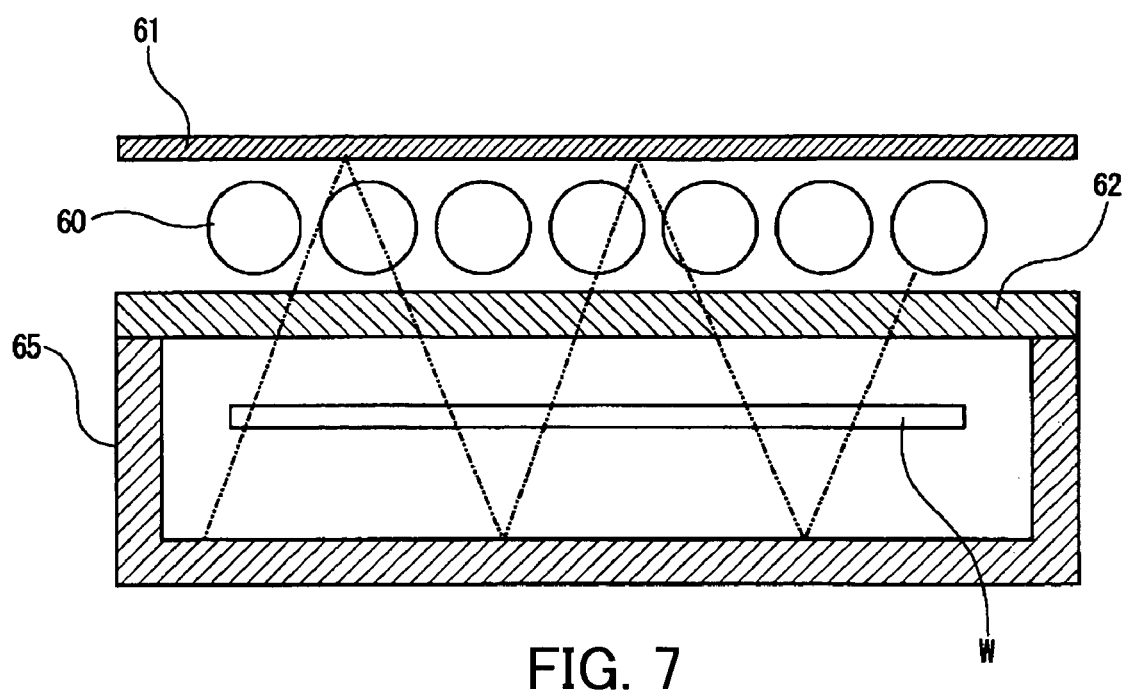
FIG. 7 is a schematic front cross sectional view of a light emitting type heat treatment apparatus equipped with a filament lamp, wherein a filament lamp is lighted by electric power which is suppressed to low level.

As mentioned above, although description of the embodiments according to the present invention is given above, the present invention is not limited to the above-mentioned embodiments, and various changes to the embodiments can be made. In the light emitting type heat treatment apparatus according to the present invention, the number and ways of arrangement of the filament lamps which form the lamp unit are not limited thereto, but it is possible to change the design according to the purpose. As shown in FIG. 4, the lamp unit 40 has a group of two or more constant temperature heating lamps 10A, whose lamp central axes are arranged so as to extend in parallel to one another at predetermined intervals on the same plane, and a second group of two or more temperature raising heating lamps 10B, whose tube axes extend so as to be in parallel to one another at the predetermined intervals on the same plane, and which extend in a direction perpendicular to the lamp central axes of the filament lamp of the first lamp group. The lamp central-axis arrangement plane of the first lamp group and the lamp central-axis arrangement plane of the second lamp group are parallel to each other. The first lamp group made up of the constant temperature heating lamps 10A is located in the work piece W side.

In order to perform temperature-distribution control (zone control) on the work piece W, in the lamp unit 40, the temperature raising heating lamps 10B and the constant temperature heating lamps 10A are grouped into two or more respectively, in which each group is connected to a power supply apparatus. Specifically, every three temperature raising heating lamp 10B are grouped as one unit, and, a total of five lamp groups (1A-1E) are formed. Each lamp group (1A-1E) is electrically connected to a separate power supply apparatus (S1-S5). Moreover, in the constant temperature heating lamps 10A which form the lamp unit 40, four of the constant temperature heating lamps 10A located in the center thereof are grouped, so as to form a lamp group 2A. Groups, each of which is made up of three constant temperature heating lamps as one unit, are formed in each side of the lamp group 2A so as to form lamp groups 2B-2E. Each lamp group (2A-2E) is electrically connected to a separate power unit (R1-R5).

The preceding description has been presented only to illustrate and describe exemplary embodiments of the present light emitting type heat treatment apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light emitting type heat treatment apparatus, comprising:
    two types of filament lamps including two or more relatively low rated power density filament lamps and two or more relatively high rated power density filament lamps whose rated power density is higher than that of the two or more relatively low rated power density filament lamps, in which a heat treatment includes a temperature raising heat process for raising a temperature of a work piece to a predetermined heat treatment temperature by light emitted from the filament lamps and a constant temperature heating process succeeding the temperature raising heating process for maintaining the predetermined heat treatment temperature of the work piece; and
    a control unit operative to control a light-ON state and a light-OFF state of the two types of filament lamps so that, for the temperature raising heat process, at least the filament lamps with relatively high rated power density are in the light-ON state and, for the constant temperature heating process, the filament lamps with relatively low rated power density are in the light-ON state and the filament lamp with relatively high rated power density are in the light-OFF state.

2. The light emitting type heat treatment apparatus according to claim 1, wherein a color temperature of the filaments of the two types of filament lamps at time of rated lighting is 2100 K (Kelvin) or more.

3. The light emitting type heat treatment apparatus according to claim 1, wherein the work piece is a silicon wafer.

4. The light emitting type heat treatment apparatus according to claim 1, wherein two or more of the relatively low rated power density filament lamps are arranged so that central axes thereof extend in parallel to each other on a first central axis plane, and two or more of the relatively high rated power density filament lamps are arranged so that central axes thereof extend in parallel to each other on a second central axis plane and perpendicular to those of the two or more of the filament lamps, wherein the first central axis plane and the second central axis plane are parallel to each other, and wherein the first central axis plane is located in a side of the work piece.

5. The light emitting type heat treatment apparatus according to claim 2, wherein two or more of the relatively low rated power density filament lamps are arranged so that central axes thereof extend in parallel to each other on a first central axis plane, and two or more of the relatively high rated power density filament lamps are arranged so that central axes thereof extend in parallel to each other on a second central axis plane and perpendicular to those of the two or more of the filament lamps, wherein the first central axis plane and the second central axis plane are parallel to each other, and wherein the first central axis plane is located in a side of the work piece.

6. The light emitting type heat treatment apparatus according to claim 3, wherein two or more of the relatively low rated power density filament lamps are arranged so that central axes thereof extend in parallel to each other on a first central axis plane, and two or more of the relatively high rated power density filament lamps are arranged so that central axes thereof extend in parallel to each other on a second central axis plane and perpendicular to those of the two or more of the filament lamps, wherein the first central axis plane and the second central axis plane are parallel to each other, and wherein the first central axis plane is located in a side of the work piece.

7. The light emitting type heat treatment apparatus according to claim 1 further including a cooling air unit, a cooling air supply nozzle connected to the cooling air unit and a blow-off mouth provided in the chamber, so that cooling air from the cooling air supply nozzle is supplied to the chamber from the blow-off mouth.

8. The light emitting type heat treatment apparatus according to claim 7, wherein the chamber has a cooling air discharge port.

9. The light emitting type heat treatment apparatus according to claim 7, wherein the blow-off mouth faces sealing portion of one of the two types of filament lamps.

10. The light emitting type heat treatment apparatus according to claim 7, wherein the blow off mouth of the cooling air supply nozzle is formed adjacent to a window member.

11. The light emitting type heat treatment apparatus according to claim 1, further including a processing stand on which the work piece is placed.

12. The light emitting type heat treatment apparatus according to claim 11, wherein the processing stand is a thin plat like annular member having an opening.

13. The light emitting type heat treatment apparatus according to claim 12, wherein the processing stand has a step portion formed in an inner peripheral portion of the opening and supports the work piece.

14. The light emitting type heat treatment apparatus according to claim 11, wherein the processing stand is made of molybdenum, tungsten, high melting point metal material, ceramic material, quarts or silicon.

15. The light emitting type heat treatment apparatus according to claim 1, further including a thermometer having two or more thermometry sections which monitor a temperature distribution of the work piece, in which the thermometer computes a temperature of a measured point of the work piece based on the temperature information from each of the thermometry sections, and a temperature control unit, and a main control unit which sends an instruction to the temperature control unit which control lighting state of the two types of filament lamps, wherein the temperature on the work piece is controlled so as to be in a uniform distribution state at a predetermined temperature.

16. The light emitting type heat treatment apparatus according to claim 15, wherein each of the thermometry sections is thermocouple or radiation thermometer.

17. The light emitting type heat treatment apparatus according to claim 15, wherein the two or more relatively high rated power density filament lamps are grouped as one unit, which is connected to a power supply apparatus.

18. The light emitting type heat treatment apparatus according to claim 15, wherein the two or more relatively low rated power density filament lamps are grouped as one unit, which is connected to a power supply apparatus.

19. The light emitting type heat treatment apparatus according to claim 1, wherein an output ratio relation which is obtained by dividing an output of the two or more relatively low rated power density filament lamps by an output of the two or more relatively high rated power density filament lamps is ¼ or less.

20. The light emitting type heat treatment apparatus according to claim 1, wherein two or more of the relatively high or low rated power density filament lamps which are located at a center thereof are grouped as a center group and two or more of the relatively high or low rated power density filament lamps which are located both side of the center group are grouped as peripheral groups.

* * * * *